US010726907B2

(12) United States Patent
Derner et al.

(10) Patent No.: US 10,726,907 B2
(45) Date of Patent: Jul. 28, 2020

(54) ELECTRONIC DEVICE WITH A SENSE AMP MECHANISM

(71) Applicant: Micron Technology, Inc., Boise, ID (US)

(72) Inventors: Scott J. Derner, Boise, ID (US); Charles L. Ingalls, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/125,326

(22) Filed: Sep. 7, 2018

(65) Prior Publication Data

US 2020/0082870 A1    Mar. 12, 2020

(51) Int. Cl.
*G11C 7/00* (2006.01)
*G11C 11/4091* (2006.01)
*G11C 11/4094* (2006.01)
*G11C 11/56* (2006.01)

(52) U.S. Cl.
CPC ...... *G11C 11/4091* (2013.01); *G11C 11/4094* (2013.01); *G11C 11/56* (2013.01)

(58) Field of Classification Search
CPC ..... G11C 7/1006; G11C 11/4096; G11C 7/10; G11C 7/1078; G11C 7/1084; G11C 7/1096; G11C 8/12; G11C 11/4097; G11C 11/4091; G11C 5/147; G11C 11/4074; G11C 2207/104
USPC .............. 365/230.03, 189.07, 226, 191, 149, 365/189.05, 205, 151, 154, 183, 185.03, 365/189.011, 189.08, 189.09, 189.15
See application file for complete search history.

(56) References Cited

U.S. PATENT DOCUMENTS

2004/0264260 A1* 12/2004 Kono .................. G11C 5/063
  365/189.07
2010/0128545 A1* 5/2010 Lee ..................... G11C 7/062
  365/205

* cited by examiner

*Primary Examiner* — Thong Q Le
(74) *Attorney, Agent, or Firm* — Perkins Coie LLP

(57) ABSTRACT

An electronic device includes: a memory cell configured to store electric charge for representing a data value, wherein the memory cell is configured to store two or more levels of the electric charge corresponding to different data values; a preamplifier operably coupled to the memory cell, the preamplifier having a common source and configured to generate an amplified signal based on amplifying a difference in the two or more levels of the stored electric charge; and a sense amplifier operably coupled to the preamplifier, the sense amplifier configured to further process the amplified signal for determining the data value stored in the memory cell.

20 Claims, 5 Drawing Sheets

US 10,726,907 B2

ELECTRONIC DEVICE WITH A SENSE AMP MECHANISM

TECHNICAL FIELD

The disclosed embodiments relate to electronic devices, and, in particular, to memory devices with a sense amp mechanism.

BACKGROUND

Electronic devices (e.g., processors, memory systems, etc.) can include semiconductor circuits configured to store and/or process information. For example, the memory devices can include volatile memory devices, non-volatile memory devices, or a combination device. Memory devices, such as dynamic random-access memory (DRAM), can utilize electrical energy to store and access data. For example, the memory devices can include Double Data Rate (DDR) RAM devices that implement DDR interfacing scheme (e.g., DDR4, DDR5, etc.) for high-speed data transfer.

With technological advancements in other areas and increasing applications, the market is continuously looking for faster, more efficient, and smaller devices. To meet the market demand, the electronic devices are being pushed to the limit. For example, as DRAM signal levels are decreasing as the device shrinks, further reducing cell capacitances and voltages. Further, various charge times is increasing due to longer digit lines. In view of the ever-increasing commercial competitive pressures, along with growing consumer expectations and the desire to differentiate products in the marketplace, it is increasingly desirable that answers be found to these problems. Additionally, the need to reduce costs, improve efficiencies and performance, and meet competitive pressures adds an even greater pressure to find answers to these problems.

DETAILED DESCRIPTION

As described in greater detail below, the technology disclosed herein relates to electronic systems, including memory devices, systems with memory devices, and related methods for improving a signal level range (e.g., a full dump signal level range and the speed at which the signal is developed). The electronic systems (e.g., DRAM devices) can include a common source preamplifier circuit (preamp) added to a cross-coupled sense amplifier (SA). The electronic systems can include a dedicated SA reference voltage that is fed into SA internal nodes. For the SA, active array digits can be precharged to ground, such that a "1" produces the largest signal and "0" produces little to no signal. Also, REF array digits can be precharged to Vcc, such that a "1" pulls the REF digit to ground via a common source preamp while the "0" ideally does not move the REF digit. An on/off control signal (RNLa) can be taken below ground to improve signal levels and speed. The SA can include a main portion and a pre-circuit. The main SA can be enabled after the pre-SA aids in signal development. The main SA can look at the difference in signal level between that of the SA REF digit and the SA Vref voltage. A MUX can be enabled after the main SA fires to connect the REF digit (Db) back to the array digit (Da) to restore data to the memory cell.

Figure 1:
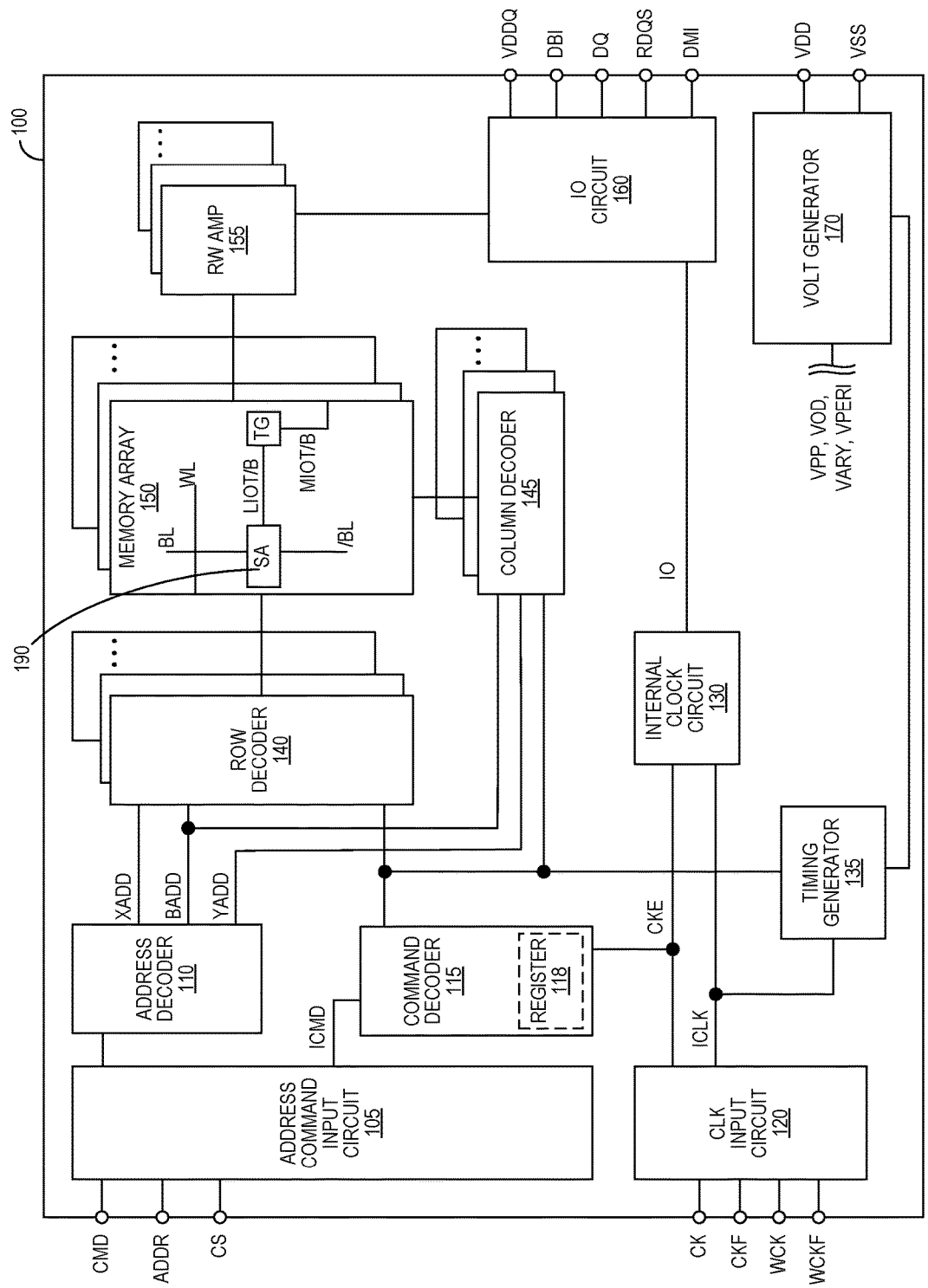
FIG. 1 is a block diagram of an electronic device in accordance with an embodiment of the present technology.

FIG. 1 is a block diagram of an electronic device/system (e.g., a memory device 100, such as a DRAM device) in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SA) 190 may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The sense amplifiers 190 can include a common source preamplifier circuit (preamp) added to a cross-coupled sense amplifier circuit (SA). The sense amplifiers 190 can include a dedicated SA reference voltage that is fed into SA internal nodes. For the SA, active array digits can be precharged to ground, such that a "1" produces the largest signal and "0" produces little to no signal. Also, REF array digits can be precharged to $V_{cc}$, such that a "1" pulls the REF digit to ground via a common source preamp while the "0" ideally does not move the REF digit. An on/off control signal (RNLa) can be taken below ground to improve signal levels and speed. The SA can include a main portion and a pre-circuit. The main SA can be enabled after the pre-SA aids in signal development. The main SA can look at the difference in signal level between that of the SA REF digit and the SA $V_{ref}$ voltage. A MUX can be enabled after the main SA fires to connect the REF digit (Db) back to the array digit (Da) to restore data to the cell. The common-source preamp in the cross-coupled SA provides improved signal level range, such as a full dump signal level range, and the speed at which the signal is developed.

The memory device 100 may employ a plurality of external terminals that include command and address terminals coupled to a command bus and an address bus to receive command signals (CMD) and address signals (ADDR), respectively. The memory device may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals (CMD), address signals (ADDR), and chip select signals (CS), from a memory controller. The command signals may represent various memory commands from the memory controller (e.g., including access commands, which can include read commands and write commands). The select signal may be used to select the memory device 100 to respond to commands and addresses provided to the command and address terminals. When an active chip select signal is provided to the memory device 100, the commands and addresses can be decoded and memory operations can be performed. The command signals may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK. The command decoder 115 may further include one or more registers 118 for tracking various counts or values (e.g., counts of refresh commands received by the memory device 100 or self-refresh operations performed by the memory device 100).

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers 190 included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. When a clock signal is at a low clock level a complementary clock signal is at a high level, and when the clock signal is at a high clock level the complementary clock signal is at a low clock level. When the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115.

The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

Figure 2:
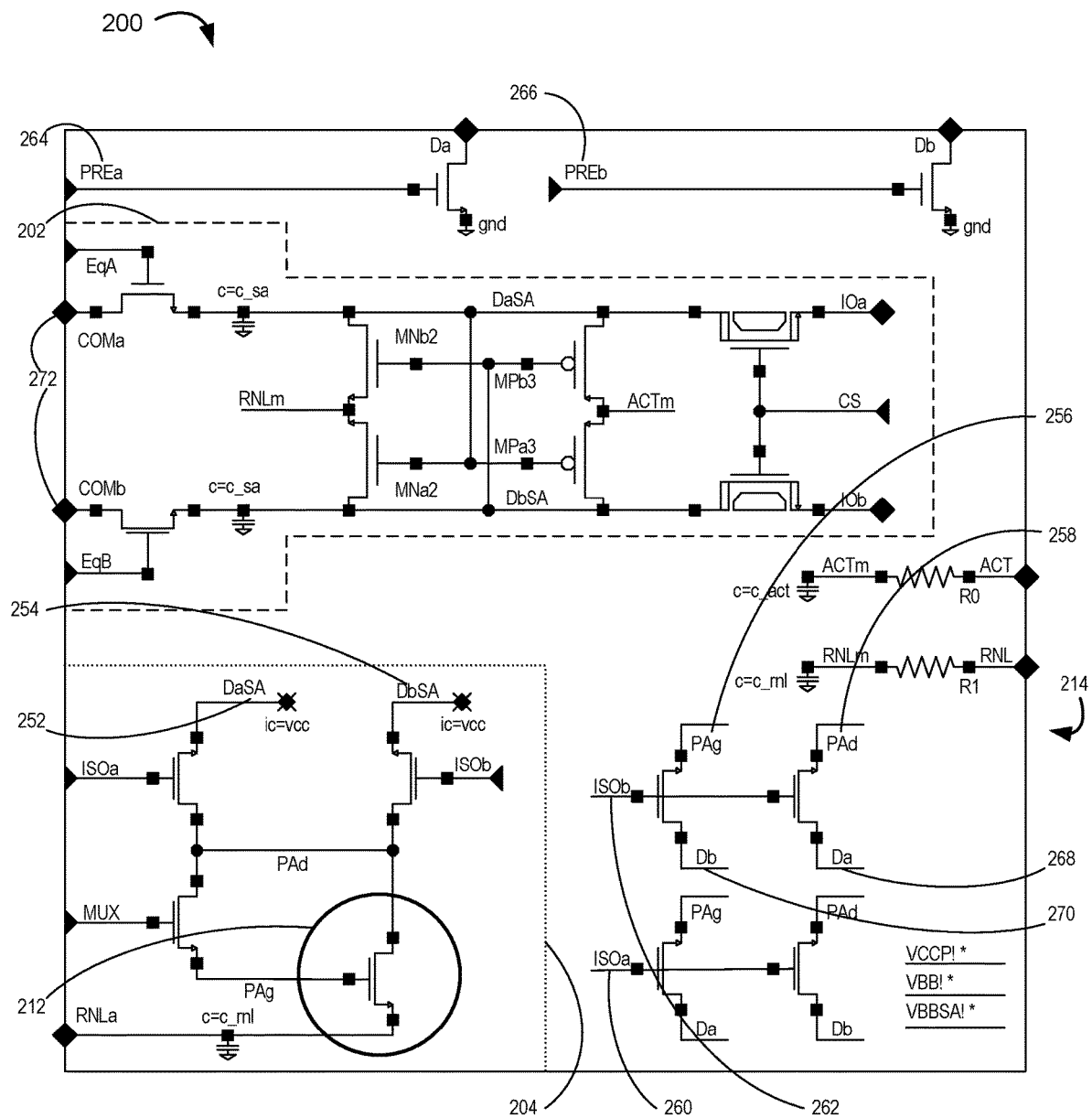
FIG. 2 illustrates an example circuit diagram of a sense amplifier in accordance with an embodiment of the present technology.

FIG. 2 illustrates an example circuit diagram of a sense amplifier (SA) module 200 in accordance with an embodiment of the present technology. The SA module 200 can be located at the end of bit-lines. The SA module 200 (e.g., the SA 190 of FIG. 1) can be configured to sense lower power signals from a bit line that represents a data bit (e.g., "1" or "0") stored in a memory cell. The SA module 200 can further amplify the small voltage swing to recognizable logic levels so the data can be interpreted properly by other circuits. The bit from the desired cell can be latched from the cell's sense amplifier into a buffer, and put on the output bus. In some embodiments, the SA module 200 can further write back in the cell, such as by applying a voltage to recharge the capacitor (e.g., memory refresh), to restore/refresh the charges that were depleted due to the read operation. The SA module 200 can be configured by a plurality of transistors that may be coupled as shown in FIG. 2. In some embodiments, each transistor having a gate added with a circle may be of a P-channel type as a P-channel device and each transistor having a gate added with no circle may be of an N-channel type as an N-channel device.

The SA module 200 can include a cross-coupled sense amplifier (SA core) 202 (represented by components illustrated within dashed-lines) coupled to a common source preamplifier (preamp) 204 (represented by components illustrated within dotted-lines). The preamp 204 can be configured to increase the voltage from the bit-lines and provide it to the SA core 202. The SA core 202 can be configured to sense the increased voltage (i.e., instead of the direct output from the bit line) and evaluate/compare the increased voltage to a reference level, such as for determining/reading the data bit stored in the memory cell. Based on the comparison, the SA core 202 can generate an increased voltage level to amplify the original voltage swing of the electrical energy stored in the memory cell.

The preamp 204 can include a common source controller 212, a signal control circuit 214, etc. The common source controller 212 (e.g., preamp device, such as a semiconductor switch) can be configured to take the direct output from the bit line (e.g., such as at the device ground), amplify it further, and provide the amplified data signal to the SA core 202. The signal control circuit 214 can be configured to control various signals, such as ground signal control, enable signals, etc., utilized in amplifying the data signal.

The SA module 200 can process various signals. For example, the SA module 200 can process a first reference digit (DaSA) 252, a second reference digit (DbSA) 254, a preamp ground (PAg) 256, a preamp reference/digit (PAd) 258, a first enable (ISOa) 260, a second enable (ISOb) 262, a first preamp enable (PREa) 264, a second preamp enable (PREb) 266, a first active digit (Da) 268, a second active digit (Db) 270, etc. The PREa 264 and the PREb 266 can be enable signals for pulling digits (e.g., the Da 268, the Db 270, etc.) to a predetermined level (e.g., ground for N-channel devices, high for P-channel devices, etc.). The ISOa 260 and the ISOb 262 can be enable signals used for the preamp 204 (e.g., for operating the common source controller 212). In further amplifying the Da 268 and the Db 270, the preamp 204 can control the PAg 256 and/or the PAd 258 based on the Da 268 and the Db 270. For example, the signal control circuit 214 can connect the PAg 256 and/or the PAd 258 directly to the Da 268 and the Db 270 according to the ISOa 260 and/or the ISOb 262. Based on processing the above signals, the SA module 200 can generate the DaSA 252 and the DbSA 254 based on amplifying the Da 268 and the Db 270.

The SA core 202 can be enabled after the preamp 204 generates (e.g., by adjusting/maintaining the initial/precharged voltage) the DaSA 252 and/or the DbSA 254. The DaSA 252 and/or the DbSA 254 can be fed into the SA core 202 through dedicated reference digit port(s) 272 (COMa/COMb). Based on receiving the DaSA 252 and/or the DbSA 254 from the preamp 204, the SA core 202 can compare the DaSA 252 and/or the DbSA 254 to the reference voltage (e.g., $V_{ref}$ for the SA core 202). For the comparison, the SA core 202 can utilize the dedicated reference digit(s) 302 (COMa/COMb) instead of a reference voltage common for the memory device 100.

The SA module 200 can further include the preamp 204, the signal control circuit 214, etc., as represented by components illustrated outside of the dashed-lines. For example, the signal control circuit 214 can be represented by the remaining components outside of both the dotted lines and the dashed lines and/or components in the preamp 204 that are connected to the common source controller 212.

Figure 3:
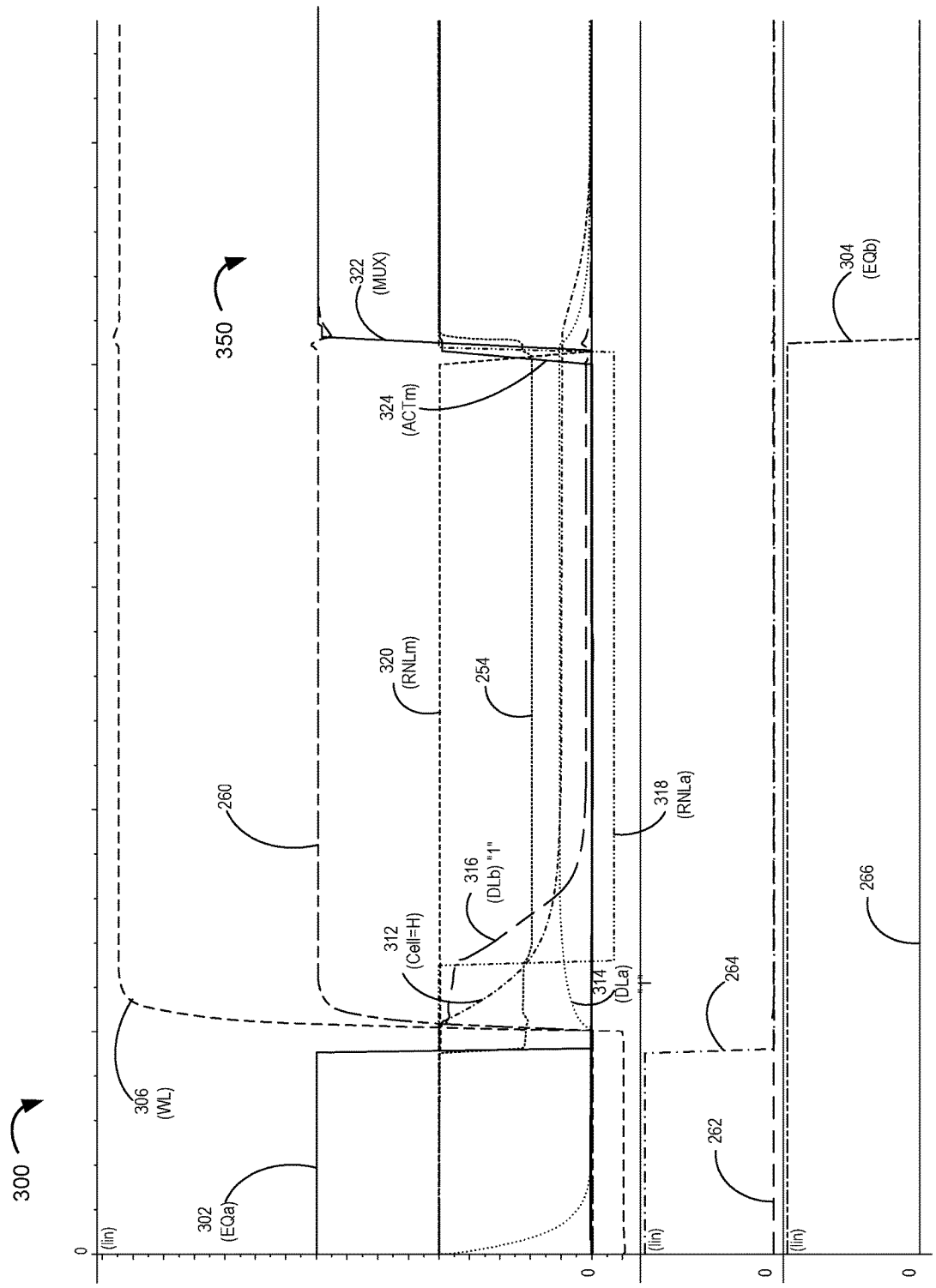
FIG. 3 illustrates a timing diagram for the electronic device in accordance with an embodiment of the present technology.

In amplifying the Da 268 and/or the Db 270 and generating the DaSA 252 and/or the DbSA 254, the SA module 200 (e.g., the signal control circuit 214) can precharge active array digits (e.g., the Da 268 and/or the Db 270) to a predetermined level. For example, as illustrated at the top of FIG. 3, the signal control circuit 214 can include a set of devices (e.g., N-channel devices) configured to precharge the Da 268 and/or the Db 270 to ground based on the PREa 264 and the PREb 266. Based on precharging the active array digits, a data value of "1" can produce the largest signal, while a data value of "0" can produce little to no signal. In some embodiments, the SA module 200 can include P-channel devices, and accordingly, the signal control circuit 214 can precharge the Da 268 and/or the Db 270 to $V_{cc}$ or a predetermined "high" voltage level.

The REF array digits (e.g., the DaSA 252, the DbSA 254) can be precharged to a predetermined voltage level (e.g., high or $V_{cc}$). For example, the SA module 200 can pull the REF array digits to ground through the preamp 204 for a data value of "1." A data value of "0" can produce little to no change in the REF array digits.

The preamp 204 (e.g., the core preamp portion) can operate according to a control signal (RNLa). The RNLa can turn the preamp 204 on/off. In some embodiments, the RNLa signal level can be taken below ground to improve signal levels and speed.

The preamp 204 can further operate according to one or more enable signals, such as the ISOa 260, the ISOb 262, the MUX signal, etc. For example, the MUX signal can be enabled after the cross-coupled sense amp 202 to connect the Db 270 back to the Da 268 to restore data to the cell. In some embodiments, the data in the array can be reversed in polarity after main sensing. The memory device 100 can utilize an extra status bit added to each row to keep track of the cell data polarity.

FIG. 3 illustrates a timing diagram 300 for the electronic device (e.g., the memory device 100 of FIG. 1, the SA module 200 of FIG. 2 therein, etc.) in accordance with a further embodiment of the present technology. The timing diagram 300 can illustrate signal/processing timing for the SA module 200. The timing diagram 300 can illustrate time across a horizontal axis and voltages across a vertical direction.

The SA module 200 (e.g., the preamp 204) can use a first core control signal (EQa) 302, a second core control signal (EQb) 304, a first preamp control signal 318 (RNLa), a second preamp control signal (RNLm) 320, etc. to control the operations. Using such signals, the SA module 200 can control a precharging operation, the voltage comparison/evaluation operation of the SA core 202, and a write-back process 350 that re-establishes charges on the read that were depleted during the read process. For example, along with driving/keeping the PREa 264 high, the SA module 200 can drive/keep both the EQa 302 and the EQb 304 high for the precharging operation. Also, the SA module 200 can keep RNLa 318 and RNLm 320 high for the precharging operation. The SA module 200 can drive the EQa 302 and the PREa 264 low and drive ISOa high to initiate the comparison/evaluation operation. Shortly after, the SA module 200 can drive the RNLa 318 low, such as at ground or a lower level. After a predetermined duration for the comparison/evaluation operation, the SA module 200 can drive the EQb 304 and the RNLm 320 low to initiate the write-back process 350. Also, the SA module 200 can drive a write-back signal (MUX) 322, the RNLa 318 high to initiate the write-back process 350.

During the precharging operation, the SA module 200 (e.g., the preamp 204) can precharge to a predetermined high (e.g., $V_{cc}$ for p-channel based circuits) or low (e.g., ground for n-channel based circuits) voltage levels. For example, as illustrated in FIG. 3, the SA module 200 can precharge a first reference digit (DLa) 314 to ground for a stored value of "1" instead of an intermediate voltage level between a high level and ground. The SA module 200 can keep/maintain a second reference digit (DLb) 316 at a high level for a stored value of "1." The SA module 200 can keep/maintain a word-line (WL) voltage 306 (e.g., output of the SA module 200) at low, such as at ground or lower. The DLb 316, and similarly the DLa 314 in other scenarios, can be used for precharging rather than as reference voltage.

Based on the precharging operation and the preamp 204, the SA module 200 can evaluate higher level signals at the SA core 202 than directly evaluating the stored charges. Accordingly, the precharging operation performed by the preamp 204 can provide reduced errors, increased full dump window signal (e.g., greater than 700 mV for a 1V cell voltage in comparison to 200 mV for traditional SA), and provide increased speeds at which the signal is developed.

For the voltage comparison/evaluation, the SA module 200 (e.g., the SA core 202) can operate one or more switches/components to allow a cell voltage 312 to decrease/discharge while allowing the WL 306 to increase/charge. The WL 306 can charge to a higher level than the level stored in the memory cell. The circuits/switches can operate according to the signal transitions described above, and the DLb 316 and the DbSA 254 can decrease/discharge. In comparison, the DLa 314 can increase/charge. In some embodiments, the DbSA 254 can settle or remain at a higher level than the cell voltage 312, the DLa 314, the DLb 316, etc. Based on the precharged voltages, the main array digits can transition to no output or stay at low for data value of "0" and share charge for data value of "1."

During the write-back process 350, the SA module 200 (e.g., the SA core 202 and/or the preamp 204) can operate one or more switches/components to charge/increase the DbSA 254. The cell voltage 312, the DLa 314, and the DLb 316 can discharge.

Figure 4:
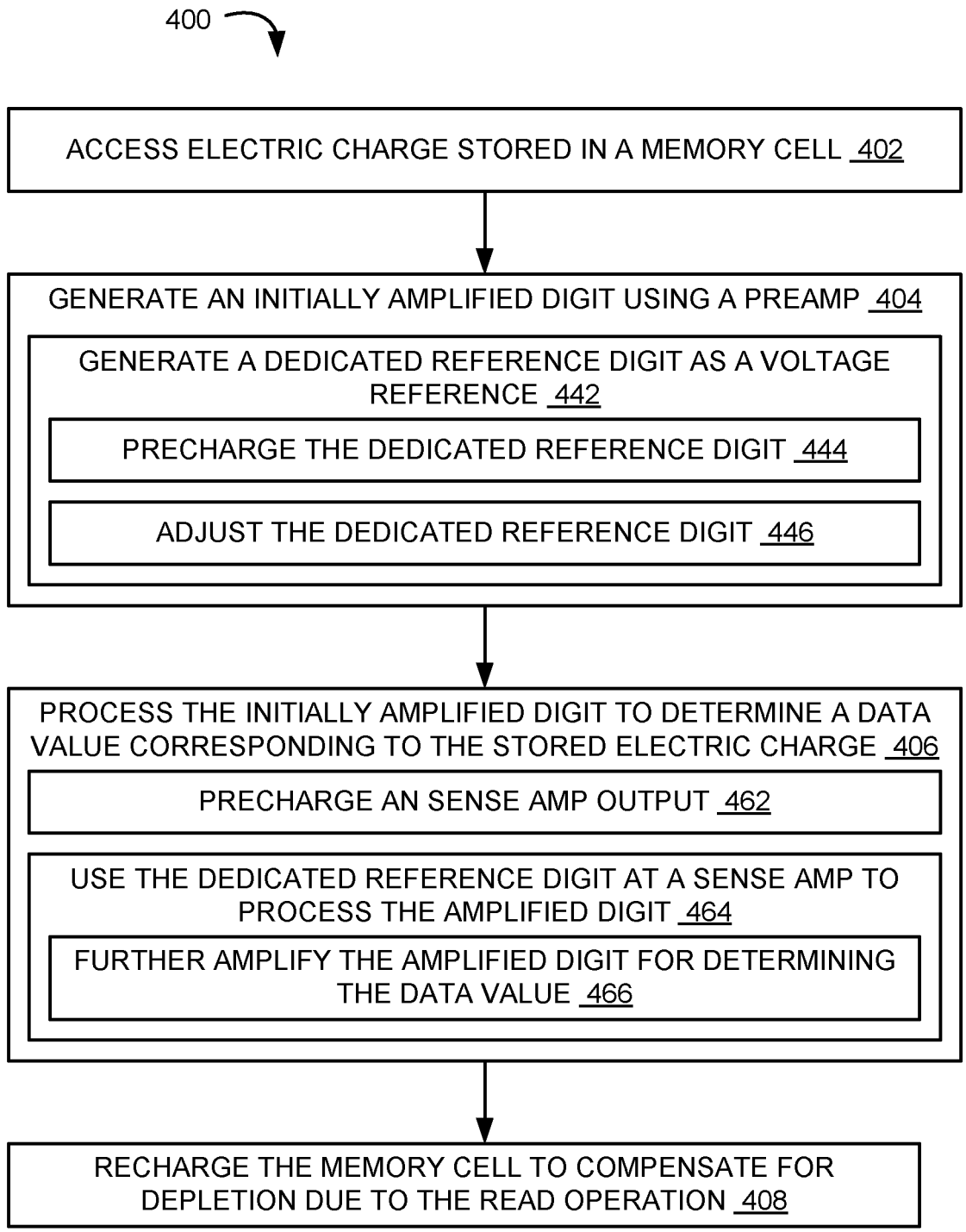
FIG. 4 is a flow diagram illustrating an example method of operating the memory device of FIG. 1 in accordance with an embodiment of the present technology.

FIG. 4 is a flow diagram illustrating an example method 400 of operating the memory device 100 of FIG. 1 in accordance with an embodiment of the present technology. The method 400 can be for operating the SA module 200 of FIG. 2 and/or FIG. 3, etc. The method 400 can be for using a preamp to initially amplify voltage stored in a memory cell, and using the amplified voltage instead of directly the voltage stored in the memory cell at the SA core 202 of FIG. 2 to further process the information stored at the memory cell.

At block 402, the memory device 100 can access one or more memory cells, such as one or more of the memory cells in the memory array 150 of FIG. 1, and the electrical charge stored therein in representation of a data value (e.g., a logic value "0," "1," or a combination thereof). For example, the SA module 200 can connect to the one or more of the memory cells, such as through one or more word lines, one or more bit lines, etc.

At block 404, the memory device 100 (e.g., the preamp 204 of FIG. 2 and/or the SA core 202 of FIG. 2) can generate an amplified signal (e.g., the Da 268 of FIG. 2, the Db 270 of FIG. 2, etc.). The preamp 204 can initially amply the amount of the stored electric charge to generate the amplified signal, which can be passed to the SA core 202. The memory device 100 can control one or more control/enable signals for the precharging operation as described above.

In some embodiments, as illustrated at block 442, the preamp 204 can generate the initially amplified signal based on generating one or more dedicated reference digits (e.g., the DaSA 252 of FIG. 2, the DbSA 254 of FIG. 2, etc.). At block 444, the preamp 204 can initially (e.g., during the precharging operation) precharge the dedicated reference digits to a predetermined level (e.g., a device/system voltage ($V_{cc}$), electrical ground, etc.). At block 446, the dedicated reference digits can be adjusted according to the data stored at the memory cell during the comparison/evaluation operation at the SA core 202. For example, the preamp 204 can adjust the dedicated reference digit from the predetermined level either to a minimum voltage level (e.g., at or near electrical ground) or adjust to/maintain a maximum voltage level (e.g., a voltage level higher than the stored electric charge, including $V_{cc}$), such as by maintaining the predetermined level. The preamp 204 can adjust the dedicated reference digit to the maximum level when the data value corresponds to "1" or to the minimum level when the data value corresponds to "0." The preamp 204 can pull the dedicated reference digit from $V_{cc}$ to ground, such as through the common source controller 212 of FIG. 2, for the stored data value of "1". For the stored data value of "0," the preamp 204 can maintain the precharged level of $V_{cc}$.

At block 406, the memory device 100 (e.g., the SA module 200 or the SA core 202 therein) can further process the initially amplified signal, such as to determine the data value for a read operation. For example, at block 462, the memory device 100 can precharge the sense amplifier output (e.g., the WL voltage, the Da 268, the Db 270, etc.) to a predetermined level (e.g., electrical ground), such as during the precharging operation. At block 464, using the dedicated reference digit (i.e., after adjustment), the SA core 202 can process the initially amplified signal from the preamp 204. For example, as illustrated at block 466, the SA core 202 can further amplify/increase the initially amplified signal. In some embodiments, the active array digits can be precharged to electrical ground during the precharging operation. During the voltage comparison/evaluation, the SA core 202 can generate an output with a larger (e.g., in comparison to the stored charges) magnitude for a data value of "1," while maintaining the output at ground for a data value of "0." The SA core 202 can determine a difference in signal levels of the SA REF digit and the SA $V_{ref}$ voltage.

At block 408, the memory device 100 (e.g., the SA module 200 or the SA core 202 therein) can recharge the memory cell to restore the electrical charges depleted during the further processing (e.g., the read operation). In some embodiments, the SA core 202 can reverse the polarity of the charges in the depleted memory cell while restoring the electrical charges. The memory device 100 can use an extra status bit, which can be added to a set of memory cells (e.g., each row), to track the cell data polarity.

The preamp 204 configured to precharge and initially increase a separation between possible voltage levels (e.g., corresponding to different possible data values) provides a large increase in a Full Dump Window signal, which can be over 700 mV for a 1V cell voltage while the traditional signal can be approximately 200 mV. The preamp 204 can be implemented with existing memory cells and/or other circuitry. Further, the preamp 204 can be configured to provide desired signal level performance by modifying WL-to SA time and/or the preamp RNLa voltage. The SA module 200 can operate without a Vt-compensating SA since the signal levels are larger than the traditional designs. The preamp 204 can be configured to sense during self-refresh time (e.g., such as to take advantage of longer WL-to-SA timing) and enable higher accuracy sensing of weak bits. Subsequently, the preamp 204 can be configured to work as a non-preamp SA during normal operation. The preamp 204 described above can be immune to noise, and generating reduced or no additional noise as it operates relatively slow compared to that of the SA core 202 during normal operation.

Figure 5:
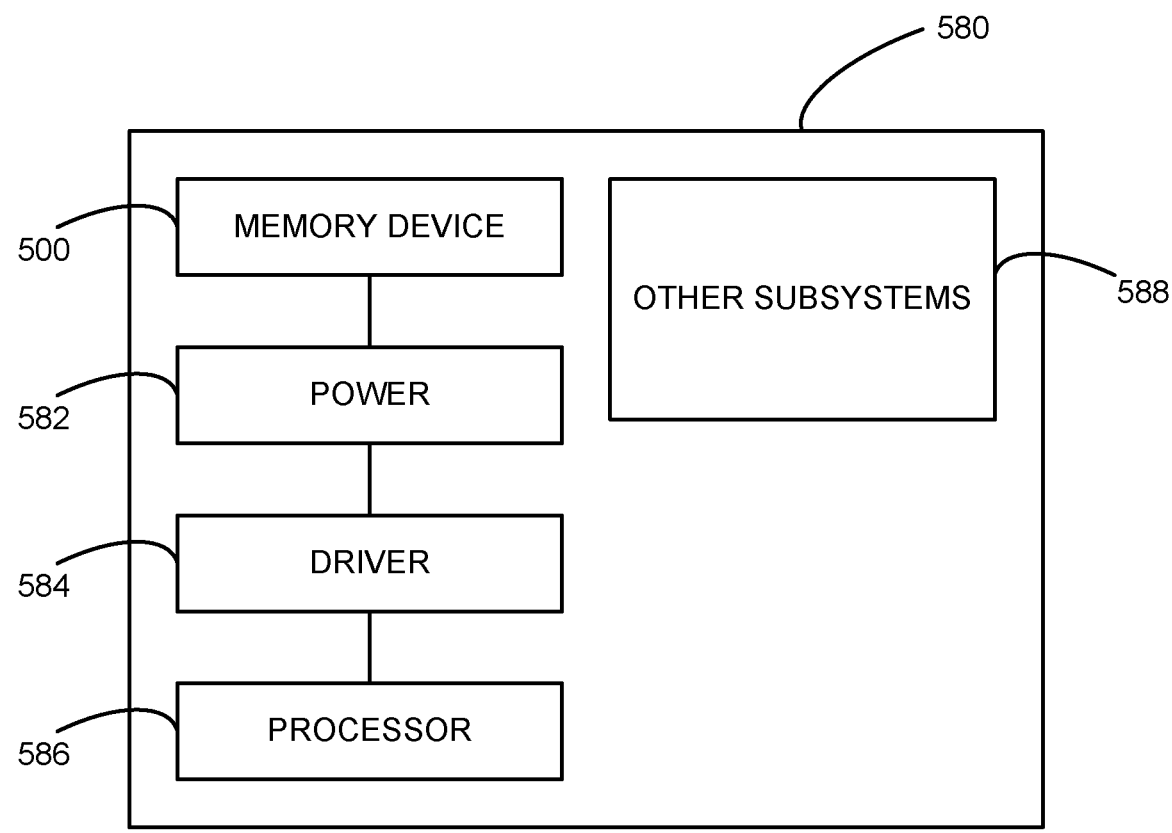
FIG. 5 is a schematic view of a system that includes a memory device in accordance with an embodiment of the present technology.

FIG. 5 is a schematic view of a system that includes a memory device in accordance with embodiments of the present technology. Any one of the foregoing memory devices described above with reference to FIGS. 1-4 can be incorporated into any of a myriad of larger and/or more complex systems, a representative example of which is system 580 shown schematically in FIG. 5. The system 580 can include a memory device 500, a power source 582, a driver 584, a processor 586, and/or other subsystems or components 588. The memory device 500 can include features generally similar to those of the memory device described above with reference to FIGS. 1-4, and can therefore include various features for performing a direct read request from a host device. The resulting system 580 can perform any of a wide variety of functions, such as memory storage, data processing, and/or other suitable functions. Accordingly, representative systems 580 can include, without limitation, hand-held devices (e.g., mobile phones, tablets, digital readers, and digital audio players), computers, vehicles, appliances and other products. Components of the system 580 may be housed in a single unit or distributed over multiple, interconnected units (e.g., through a communications network). The components of the system 580 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the memory devices have been described in the context of DRAM devices. Memory devices configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-5.

We claim:

1. An electronic device, comprising:
a memory cell configured to store two or more levels of electric charge corresponding to two or more different data values;
a preamplifier operably coupled to the memory cell, the preamplifier having a common source and configured to generate an amplified signal based on amplifying a difference in the two or more levels of the stored electric charge; and a sense amplifier operably coupled to the preamplifier, the sense amplifier configured to further process the amplified signal for determining the data value stored in the memory cell.

2. The electronic device of claim 1, further comprising a signal control circuit including one or more N-channel devices and configured to initially precharge a sense amp output to electrical ground.

3. The electronic device of claim 1, further comprising a signal control circuit including one or more P-channel devices and is configured to initially precharge a sense amp output to a predetermined level higher than electrical ground.

4. The electronic device of claim 1, wherein the sense amplifier includes one or more dedicated-reference portions configured to receive a dedicated reference digit, wherein the sense amplifier is configured to amplify the difference based on the dedicated reference digit.

5. The electronic device of claim 4, wherein the dedicated reference digit is initially precharged to a predetermined level.

6. The electronic device of claim 5, wherein the predetermined level corresponds to a system voltage ($V_{cc}$).

7. The electronic device of claim 5, wherein the preamplifier is configured to adjust the dedicated reference digit to either a maximum level when the data value corresponds to "1" or a minimum level when the data value corresponds to "0".

8. The electronic device of claim 5, wherein the preamplifier is configured to generate the dedicated reference digit based on adjusting the dedicated reference digit to either a voltage level at or near electrical ground or a different voltage level higher than the stored electric charge.

9. The electronic device of claim 5, wherein the preamplifier includes a common source controller configured to adjust the dedicated reference digit according to the stored electric charge.

10. The electronic device of claim 9, wherein the common source controller is configured to either couple the dedicated reference digit to an electrical ground when the data value corresponds to "1" or maintain the predetermined level when the data value corresponds to "0".

11. The electronic device of claim 9, wherein the common source controller is configured to operate based on a preamp control signal.

12. The electronic device of claim 11, wherein the preamp control signal is at a level lower than electrical ground when the sense amplifier further processes the amplified output for improving signal levels and/or signal speed, wherein the sense amplifier is configured to further increase the amplified output based on the preamp control signal, the dedicated reference digit, or a combination thereof.

13. The electronic device of claim 1, wherein the sense amplifier is further configured to recharge the memory cell to restore electrical charge depleted during the further processing, wherein the further processing corresponds to a read.

14. The electronic device of claim 13, wherein the sense amplifier is configured to:
restore the electrical charges based on reversing a polarity of the charges;
set a tracking bit that is associated with the memory cell, wherein the tracking bit represents the polarity.

15. The electronic device of claim 1, wherein the electronic device is a dynamic random-access memory (DRAM) device.

16. A method of operating an electronic device, the method comprising:
accessing an amount of electric charge stored at a memory cell, wherein the amount of electric charge represents a data value;
using a preamplifier, generating an amplified signal for a sense amplifier based on initially amplifying the amount of electric charge; and
processing the amplified signal with a sense amplifier for determining the data value.

17. The method of claim 16, wherein generating the amplified signal includes using a dedicated reference digit as a voltage reference in initially amplifying the amount of electric charge.

18. The method of claim 17, wherein generating the amplified signal includes initially precharging the dedicated reference digit to a predetermined level and then adjusting the dedicated reference digit according to the amount of electric charge.

19. The method of claim 18, wherein adjusting the reference digit includes adjusting the dedicated reference digit from the predetermined level to either a voltage level at or near electrical ground or a different voltage level higher than the stored electric charge.

20. The method of claim 19, wherein:
precharging the dedicated reference digit includes precharging the dedicated reference to a system voltage ($V_{cc}$);
adjusting the dedicated reference digit includes adjusting the dedicated reference digit to either a maximum level when the data value corresponds to "1" or a minimum level when the data value corresponds to "0;" and
further comprising:
initially precharging the amplified signal to electrical ground.

* * * * *